(12) United States Patent  (10) Patent No.: US 8,017,868 B2
Umeno et al.  (45) Date of Patent: Sep. 13, 2011

(54) MULTILAYER STRUCTURE, ELECTRODE FOR ELECTRICAL CIRCUIT USING THE SAME, AND METHOD FOR PRODUCING THE SAME

(75) Inventors: Satoshi Umeno, Chiba (JP); Katsunori Honda, Chiba (JP); Kazuyoshi Inoue, Chiba (JP)

(73) Assignee: Idemitsu Kosan, Co., Ltd., Tokyo (JP)

( * ) Notice: Subject to any disclaimer, the term of this patent is extended or adjusted under 35 U.S.C. 154(b) by 422 days.

(21) Appl. No.: 12/161,435

(22) PCT Filed: Jan. 15, 2007

(86) PCT No.: PCT/JP2007/050399
§ 371 (c)(1),
(2), (4) Date: Jul. 18, 2008

(87) PCT Pub. No.: WO2007/083590
PCT Pub. Date: Jul. 26, 2007

(65) Prior Publication Data
US 2010/0224390 A1  Sep. 9, 2010

(30) Foreign Application Priority Data
Jan. 19, 2006 (JP) .................... 2006-011716

(51) Int. Cl.
*H01B 5/00* (2006.01)
(52) U.S. Cl. .................................. 174/126.2
(58) Field of Classification Search ........... 174/36, 174/126.1, 126.2; 257/784; 438/617
See application file for complete search history.

(56) References Cited

U.S. PATENT DOCUMENTS

| 6,365,016 B1 * | 4/2002 | Iacovangelo et al. .... 204/192.38 |
| 6,743,488 B2 * | 6/2004 | Memarian et al. ............ 428/1.4 |
| 6,787,989 B2 * | 9/2004 | Wada et al. ................... 313/504 |
| 2002/0101548 A1 | 8/2002 | Kim |
| 2008/0093600 A1 | 4/2008 | Park et al. |

FOREIGN PATENT DOCUMENTS

| JP | 3-29216 A | 2/1991 |
| JP | 10-253992 A | 9/1998 |
| JP | 2000-200763 A | 7/2000 |
| JP | 2001-152323 A | 6/2001 |
| JP | 2002-83812 A | 3/2002 |
| JP | 2005-062889 A | 3/2005 |

OTHER PUBLICATIONS

International Search Report completed Mar. 12, 2007 in International Patent Application No. PCT/JP2007/050399 filed Jan. 15, 2007.
Translation of International Search Report and Written Opinion completed on Mar. 12, 2007 in International Patent Application No. PCT/JP2007/050399 filed Jan. 15, 2007.
Mechanical Translation of JP 2000-200763. Accessed on Dec. 16, 2010 at http://www4.ipdl.inpit.go.jp/. (20 pages).

(Continued)

*Primary Examiner* — William Mayo, III
(74) *Attorney, Agent, or Firm* — Millen, White, Zelano & Branigan, P.C.

(57) ABSTRACT

A multilayer structure including a transparent conductive thin film and a molybdenum metal thin film wherein difference of internal stress between the transparent conductive thin film and the molybdenum metal thin film is 1600 MPa or less.

20 Claims, 3 Drawing Sheets

OTHER PUBLICATIONS

Supplementary European Search Report of Oct. 5, 2009 for European Application No. EP 07 70 6733.

Dhere, Neelkanth G., et al. "Large area CIGS2 thin film solar cells on foils: nucleus of a pilot plant" Solar Energy, 77:697-703 (2004).

Hinze, J. et al. "In situ measurement of mechanical stress in polycrystalline zinc-oxide thin films prepared by magnetron sputtering", Journal of Applied Physics, 88(5):2443-2448 (Sep. 1, 2000).

* cited by examiner

MULTILAYER STRUCTURE, ELECTRODE FOR ELECTRICAL CIRCUIT USING THE SAME, AND METHOD FOR PRODUCING THE SAME

TECHNICAL FIELD

The invention relates to a multilayer structure comprising a transparent conductive thin film and a molybdenum metal thin film, an electrode for an electrical circuit using the same, and a method for producing the multilayer structure. More particularly, the invention relates to various transparent thin films containing indium oxide, a multilayer structure comprising an indium oxide-tin oxide (ITO) thin film and a molybdenum metal thin film, an electrode for an electrical circuit using the same, and a method for producing the multilayer structure.

BACKGROUND

A thin film obtained by stacking an ITO thin film and a molybdenum thin film is used as part of an electrical circuit of a liquid crystal display or other electric devices. It is known that, when a molybdenum thin film is deposited on an ITO thin film, internal stress is generated in each of the formed thin films, causing the films to be peeled off or broken.

The internal stress is divided into two stresses; tensile stress and compression stress. Here, the tensile stress is stress generated in a thin film when the deposited film surface is depressed, and the compression stress is stress generated in a thin film when the deposited film surface is projected.

Normally, an ITO film is subjected to compression stress and a metal thin film (especially a molybdenum thin film) is subjected to tensile stress. If a multilayer structure is obtained by stacking these thin films under such stresses, these thin films eventually peel off or are broken since not only the type of stress is different (compression and tensile) but also the degree of difference in stress becomes large between compression stress and tensile stress, thereby causing a significant degree of warping to be generated at the interface.

For the above-mentioned reason, conventional multilayer structures are disadvantageous, since adhesiveness between an ITO thin film and a molybdenum thin film is poor, cracking or breakage of these films occur due to stress generated between the thin films, resulting in increased defectiveness in products and lowered production yield (Patent Document 1).

In order to solve the above-mentioned problem, a method is disclosed in which complicated steps are combined to produce a multilayer film which is free from peeling and breakage. This method is, however, disadvantageous since production yield is lowered due to increased production steps (Patent Document 2).

For example, in a polycrystalline ITO (p-ITO) method, a multilayer body is produced by depositing a p-ITO film using a vacuum sputtering apparatus, etching the resulting ITO film, depositing a film of molybdenum thereon by means of a sputtering apparatus, and etching the resulting molybdenum film. This method is complicated since film deposition and etching are repeated twice, and hence suffers from poor productivity.

Under such circumstances, a technique has been demanded in which the processes of film deposition and etching can be simplified while preventing cracking and breakage of films caused by stress between an ITO thin film and a molybdenum thin film.
Patent Document 1: JP-A-10-253992
Patent Document 2: JP-A-2005-62889

The invention has been made in view of the above-mentioned problem. An object of the invention is to provide a multilayer structure which contributes to a decrease in product defectiveness ascribable to cracking or breakage of wiring materials, as well as to improvement of production yield.

Another object of the invention is to provide a method for producing the above-mentioned multilayer structure.

Still another object of the invention is to provide an electrode for an electrical circuit comprising the above-mentioned multilayer structure.

Further object of the invention is to provide an electric device comprising the above-mentioned multilayer structure or the above-mentioned electrode for an electrical circuit.

SUMMARY OF THE INVENTION

The inventors have made intensive studies to solve the subject, and as a result, have found that, when a transparent conductive film and a molybdenum film are formed by sputtering, stress generated at the interface thereof is reduced by decreasing the difference of internal stress between these films by adjusting a discharge gas pressure. By doing this, not only cracking and wiring breakage can be prevented but also production yield can be improved due to simplification of production steps. This finding has led to the completion of the invention.

The invention provides the following multilayer structure or the like.

1. A multilayer structure comprising a transparent conductive thin film and a molybdenum metal thin film wherein difference of internal stress between the transparent conductive thin film and the molybdenum metal thin film is 1600 MPa or less.
2. The multilayer structure according to 1 wherein the transparent conductive thin film is a thin film containing indium oxide and tin oxide.
3. The multilayer structure according to 1 wherein the transparent conductive thin film is a thin film containing indium oxide and zinc oxide.
4. The multilayer structure according to 1 wherein the transparent conductive thin film is a thin film containing indium oxide, tin oxide and zinc oxide.
5. The multilayer structure according to 1 wherein the transparent conductive thin film is a thin film containing indium oxide and an oxide of a rare earth element.
6. An electrode for an electrical circuit comprising the multilayer structure according to any one of 1 to 5.
7. An electronic device comprising, as at least part thereof, the multilayer structure according to any one of 1 to 5 or an electrical circuit comprising the electrode for an electrical circuit according to 6.
8. A method for producing the multilayer structure according to any one of 1 to 5 comprising forming a transparent conductive thin film by sputtering at a first discharge gas pressure and forming a molybdenum metal thin film by sputtering at a second discharge gas pressure,
the first discharge gas pressure and the second discharge gas pressure being adjusted to cause difference of internal stress between the transparent conductive film and the metal thin film to be 1600 MPa or less.
9. The multilayer structure according to any one of 1 to 5 produced by forming a transparent conductive thin film by sputtering at a first discharge gas pressure and forming a molybdenum metal thin film by sputtering at a second discharge gas pressure,
the first discharge gas pressure and the second discharge gas pressure being adjusted to cause difference of internal stress between the transparent conductive film and the metal thin film to be 1600 MPa or less.

10. An electrode for an electrical circuit comprising the multilayer structure according to 9.

11. An electronic device comprising, as at least part thereof, the multilayer structure according to 9 or an electrical circuit comprising the electrode for an electrical circuit according to 10.

The invention can provide a multilayer structure capable of contributing to a decrease in product defectiveness ascribable to cracking of wiring materials or wiring breakage materials as well as improvement in production yield.

The invention can provide a method for producing the multilayer structure.

The invention can provide an electrode for an electrical circuit comprising the multilayer structure.

The invention can provide an electronic device comprising the multilayer structure or the electrode for an electrical circuit.

BEST MODE FOR CARRYING OUT THE INVENTION

Figure 1:
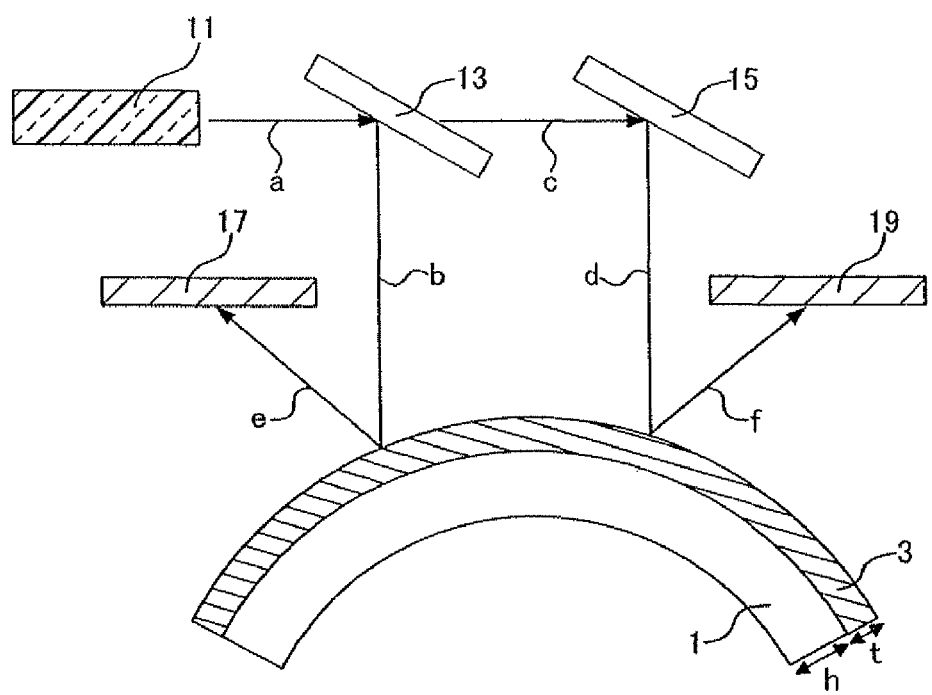
FIG. 1 is a diagrammatical view showing the measuring method by an optical lever method.

The multilayer structure of the invention is a thin film obtained by stacking a transparent conductive film and a molybdenum thin metal film, and hence it can be called a thin film multilayer structure. The multilayer structure is normally formed by stacking on a substrate a transparent conductive thin film and a molybdenum metal thin film in this order. Also, the multilayer structure of the invention can be formed by stacking on a substrate a molybdenum metal thin film and a transparent conductive thin film in this order. In the multilayer structure of the invention, each layer may be patterned in a desired shape. That is, the multilayer structure of the invention can be formed if each of the transparent conductive thin film and the molybdenum metal thin film is patterned in a required shape and at least part of the resulting patterns are overlapped.

The thickness of the transparent conductive thin film of the invention is normally 10 to 500 nm, preferably 10 to 100 nm, and more preferably 20 to 50 nm. The thickness of the molybdenum metal thin film is normally 10 to 500 nm, preferably 20 to 200 nm. The thickness of each film can be selected according to application insofar as the multilayer structure of the invention can be formed such that the difference of internal stress between the transparent conductive film and the molybdenum metal thin film becomes 1600 MPa or less.

Although there are no particular restrictions on the substrate, glass, quarts, plastics or the like are normally used.

There are no particular restrictions on the transparent conductive thin film of the invention insofar as it is transparent and conductive. The transparent conductive thin film of the invention is a thin film containing one or more oxides selected from the group consisting of indium oxide, tin oxide, zinc oxide and an oxide of a rare earth element. Preferably, the transparent conductive thin film of the invention is a thin film containing indium oxide and one or more oxides selected from the group consisting of tin oxide, zinc oxide and an oxide of a rare earth element. The transparent conductive thin film of the invention is preferably a thin film containing indium oxide and tin oxide, a thin film containing indium oxide and tin oxide, a thin film containing indium oxide, tin oxide and zinc oxide or a thin film containing indium oxide and an oxide of a rare earth element.

Specific examples of the transparent electrode thin film of the invention include an indium oxide-tin oxide (ITO) thin film, an indium oxide-zinc oxide (IZO) thin film, an indium oxide-tin oxide-zinc oxide (ITZO) thin film, an indium oxide-cerium oxide (ICO) thin film and an indium oxide-samarium oxide (ISmO) thin film.

If the transparent electrode thin film contains a plurality of oxides, these oxides are normally used in the form of a composite oxide. However, as long as the transparent electrode thin film has transparency and conductivity which are high enough to be used as a transparent electrode, these oxides may be a compound or a mixture.

If the transparent electrode thin film of the invention is a thin film containing indium oxide and tin oxide, it is normally desired that they form a composite oxide of indium oxide and tin oxide. Although there are no particular restrictions, the weight ratio of each oxide is normally 80:20 to 99:1, preferably 85:15 to 95:5. Outside this range, transparency or conductivity may be lowered, and insufficient etching or poor electrical connection may occur.

If the transparent electrode film of the invention is a thin film containing indium oxide and zinc oxide, it is desired that they form a composite oxide of indium oxide and zinc oxide. Although there are no particular restrictions, the weight ratio of each oxide is normally 50:50 to 99:1, preferably 60:40 to 90:10. Outside this range, transparency or conductivity may be lowered, and insufficient etching or poor electrical connection may occur.

If the transparent electrode film of the invention is a thin film containing indium oxide, tin oxide and zinc oxide, it is desired that they form a composite oxide of indium oxide, tin oxide and zinc oxide. The weight ratio of indium oxide and the total of tin oxide and zinc oxide is normally 50:50 to 99:1, preferably 60:40 to 95:5. Outside this range, transparency or conductivity may be lowered, and insufficient etching or poor electrical connection may occur.

If the transparent electrode film of the invention is a thin film containing indium oxide and an oxide of a rare earth element, it is desired that they form a composite oxide composed of indium oxide and tin oxide. The weight ratio of each oxide is normally 80:20 to 99:1, preferably 90:10 to 98:2. Outside this range, transparency or conductivity may be lowered, and insufficient etching or poor electrical connection may occur.

In the invention, difference of internal stress between the transparent conductive film and the molybdenum metal thin film is 1600 MPa or less, preferably 1400 MPa or less, more preferably 1350 MPa or less. If the difference of internal stress is outside this range, the transparent conductive thin film and the molybdenum metal thin film may be peeled off or cause wiring breakage.

The internal stress as specified in the invention is measured by the optical lever method. The method is explained with reference to FIG. 1.

In this figure, a film 3 is formed on a substrate 1. Due to the internal stress generated in the film 3, the substrate 1 and the thin film 3 are warped. In most cases, the substrate 1 is warped and has a radius of curvature R1 in the initial state. Therefore, with a warp amount when the film 3 is formed on the substrate 1 being R2, the amount R of warp caused by the formation of the film 3 can be calculated by the following formula:

$$R = R1 \times R2/(R1-R2)$$

Using a laser beam, the warp amounts R1 and R2 are measured. A laser beam a is emitted from a laser head 11. Part thereof b is directed to the film 3 by means of a beam splitter 13, while the part thereof c advances straight. The laser beam c is reflected in the direction of the film 3 by means of a mirror 15. Laser beams b and d are both reflected by the film 3, and light amount and wavelength are detected by means of detectors 17 and 19. The warp amounts R1 and R2 are measured from the amount of change in the light amount and the wavelength. The warp amount R is obtained from the warp amounts R1 and R2, and a thin film stress σ is obtained by the following formula:

$$\sigma = Eh^2/\{(1-v)6Rt\}$$

wherein E/(1−v): biaxial elastic constant of substrate (Pa)
h: thickness (m) of substrate
t: thickness (m) of thin film
R: warp of substrate (m)
σ: average value (Pa) of thin film stress If the thin film stress σ is a positive value, the stress is tensile stress, and if the thin film stress σ is a negative value, the stress is compression stress.

The multilayer structure of the invention can be produced by the following method:

The transparent conductive thin film and the molybdenum metal thin film are formed by sputtering. At this time, the difference of internal stress generated in the film is controlled by adjusting the discharge gas pressure of each film during film formation.

In order to cause the difference of internal stress between the transparent conductive film and the molybdenum metal thin film to be 1600 MPa or less, the discharge gas pressure is adjusted by the following method, for example.

The discharge gas pressure during the formation of the transparent conductive thin film depends on its relationship with the discharge gas pressure during the formation of the molybdenum metal thin film. Normally, the discharge gas pressure is desirably 0.1 Pa or more, more preferably 0.5 Pa or more. Although there are no particular restrictions, the upper limit thereof is preferably 5 Pa. If the discharge gas pressure is less than 0.1 Pa, vacuuming operation takes time, resulting in problems such as the need of a large-sized vacuum pump. If the discharge gas pressure exceeds 5 Pa, the specific resistance of the transparent conductive film may increase suddenly, making the film unusable from a practical view point.

The discharge gas pressure during the formation of the molybdenum metal thin film depends on its relationship with the discharge gas pressure during the formation of the transparent conductive thin film. Normally, the discharge gas pressure is desirably 0.1 Pa or more, more preferably 0.3 Pa or more. Although there are no particular restrictions, the upper limit thereof is preferably 2 Pa. If the discharge gas pressure is less than 0.1 Pa, internal stress may be too large. If the discharge gas exceeds 2 Pa, the film formation speed may be too slow from a practical viewpoint.

The film formation conditions other than the discharge gas pressure are as follows. The substrate temperature is normally ranging from room temperature to 400° C. Normally, it is desirable that the film formation gas be argon, or a mixture of argon and oxygen.

Specific examples of the method for producing the multilayer structure of the invention include the following method (amorphous ITO (a-ITO) method).

1. Forming an a-ITO film and a molybdenum film using a vacuum sputtering apparatus
2. Applying a resist, followed by exposure and development
3. Etching molybdenum with a PAN (phosphoric acid/acetic acid/nitric acid)-based etchant
4. Etching a-ITO with an oxalic acid-based etchant
5. Applying a resist, followed by exposure, development and heating
6. Etching molybdenum with a PAN (phosphoric acid/acetic acid/nitric acid)-based etchant
7. Stacking an SiNx film by the CVD method (300° C.)

In stacking the a-ITO film and the molybdenum film, since the difference of internal stress is large between these two films, cracking and wiring breakage occur due to generation of stress at the interface thereof. Therefore, conventionally, to enhance adhesiveness between the a-ITO film and the molybdenum film, the film formation process 1 mentioned above is required to be a multi-stage process. However, according to the production method of the invention, no stress is generated at the interface due to small difference in internal stress between the ITO film and the molybdenum film, and cracking and wiring breakage do not occur. Accordingly, film formation is simplified to a single step, resulting in an improved production yield.

Using the multilayer structure of the invention, an electrode for an electrical circuit, further an electrical circuit, can be produced, which circuit can be used in an electronic device.

For example, the multilayer structure of the invention can be used as an electrical circuit of an electronic device such as liquid crystal displays, organic electroluminescence devices and plasma display panels.

EXAMPLES

The invention will be described in more detail according to the following examples, which should not be construed as limiting the scope of the invention. Various modifications and variations can be made appropriately according to application.

Examination Example 1

(1) Deposition of ITO and Measurement of its Internal Stress

An ITO target (indium oxide:tin oxide=90:10 wt %) having a diameter of 4 inches was installed in a magnetron sputtering apparatus, and a 200 nm-thick thin film was deposited over the entire surface of a silicon wafer having a diameter of 4 inches (thickness: 0.3 mm).

The film deposition conditions are as follows:
Substrate temperature: Room temperature
Type of gas used for film deposition: 89% of argon, 9% of hydrogen, and 2% of oxygen
The deposition pressure was varied from 0.1 to 1.3 Pa, and the internal stress of the thin film was calculated by the above-mentioned method from the displacement of the silicon wafer. The biaxial elastic constant of the substrate (silicon wafer) was $2.290 \times 10^{11}$ Pa for Si(111). Using a thin film stress measurement apparatus (F2410, supplied by TENCOR), the measurement was conducted in a nitrogen stream using a laser beam with a wavelength of 670 nm.

Figure 2:
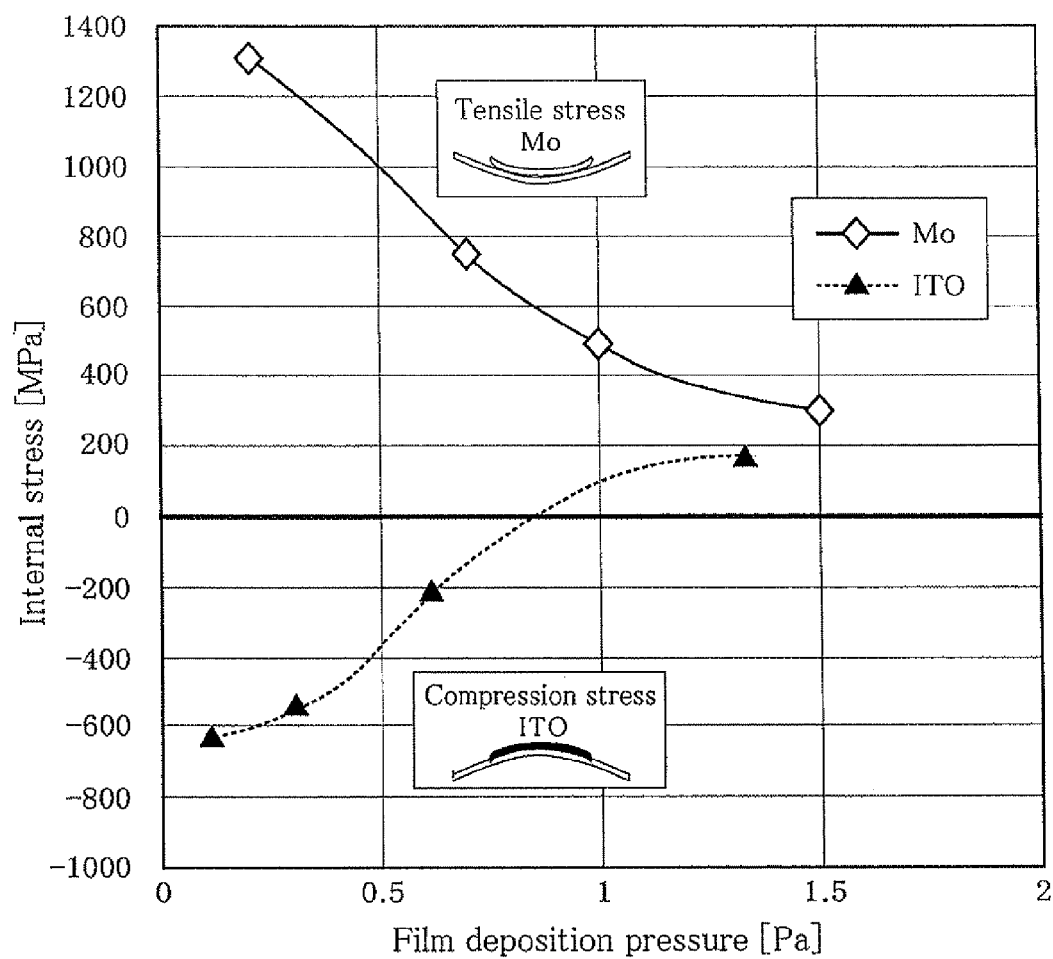
FIG. 2 is a graph showing a relationship between the film deposition pressure and the internal stress of ITO and Mo.

The results are shown in Table 1 and FIG. 2.

(2) Deposition of Mo and Measurement of its Internal Stress

In the same manner as in (1) mentioned above, a Mo (99.99% of purity) target having a diameter of 4 inches was installed in a magnetron sputtering apparatus, and a 200 nm-thick thin film was deposited over the entire surface of a silicon wafer having a diameter of 4 inches (thickness of 0.3 mm).

The film deposition conditions are as follows:
Substrate temperature: Room temperature
Type of gas used for film deposition: 100% of argon
The deposition pressure was varied from 0.2 to 1.5 Pa, and the internal stress of the thin film was calculated by the above-mentioned method from the displacement of the silicon wafer.

The results are shown in Table 1 and FIG. 2.

Examination Example 2

(1) Stress-Temperature Characteristics of Mo Film and ITO Film

The stress-temperature characteristics were measured for the ITO films deposited at deposition pressures of 0.1 Pa and 0.6 Pa and the Mo film deposited at a deposition pressure of 0.2 Pa, which were obtained in Examination Example 1. Specifically, these thin films were heated in a temperature range of 20° C. to 330° C. (heating rate of 5° C./min), kept for 30 minutes at 330° C., and then cooled to 50° C. The stress during this process was measured in the manner as in Examination Example 1.

Figure 3:
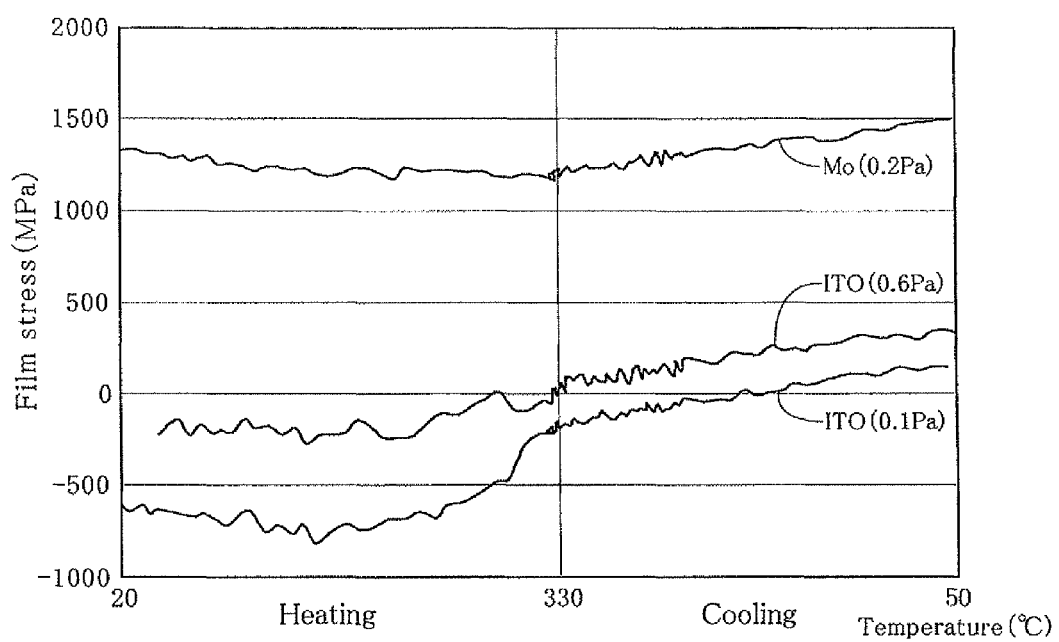
FIG. 3 is a graph showing a relationship between the thin film stress and temperature of an ITO film and an Mo film.

The results obtained are shown in FIG. 3.

The difference of internal stress between the ITO film formed at a deposition pressure of 0.6 Pa and the Mo film formed at a deposition pressure of 0.2 Pa was 1550 MPa. This difference was almost the same or was slightly reduced at the time of heating and at the time of cooling.

Therefore, the adhesiveness of the thin film appeared to be free from deterioration.

Example 1

In a magnetron sputtering apparatus, an ITO target (indium oxide:tin oxide=90:10 wt %) having a diameter of 4 inches and a Mo target (99.99% of purity) having a diameter of 4 inches were installed. On a 10 cm-square glass substrate, a 200 nm-thick ITO thin film and a 200 nm-thick Mo thin film were deposited at a discharge gas pressure shown in Table 1.

The resulting multilayer body was notched in squares, and the tape peel test was conducted to confirm the peeling state.

The following scratch test was conducted.

As the scratch tester, a micro-scratch-tester supplied by CSME was used. The conditions for measuring the peel strength are as follows:
Scratch distance: 20 mm
Scratch load: 0 to 10 N (Newton)
Load rate: 10 N/min
Scratch rate: 20 mm/min
Shape of diamond cone: Having a diameter of 200 μm at the front end The specimen after the scratch test under the above-mentioned conditions was observed by means of an optical microscope. Taking the point where the underlying transparent conductive thin film (ITO film) was exposed as the point where the Mo thin film was peeled (after confirming the transparent conductive film was not peeled). The distance from the point at which the scratch started was measured to calculate the peeling load.

The results are shown in Table 1.

Examples 2 to 4

A multilayer body was produced and evaluated under the same conditions as those in Example 1, except that the discharge gas pressure at the time of deposition of ITO and Mo was changed to those shown in Table 1.

Example 5

A multilayer body of an IZO film and an Mo film was produced and evaluated under the same conditions as those in Example 1, except that an IZO (indium oxide:zinc oxide=90:10 wt %) target having a diameter of 4 inches and the discharge gas pressure during the deposition of IZO and Mo was changed to those shown in Table 1.

Example 6

A multilayer body of an ITZO film and an Mo film was produced and evaluated under the same conditions as those in Example 1, except that an ITZO (indium oxide:tin oxide:zinc oxide=65:20:15 wt %) target having a diameter of 4 inches and the discharge gas pressure during the deposition of ITZO and Mo was changed to those shown in Table 1.

Comparative Examples 1 to 2

A multilayer body was produced under the same conditions as those in Example 1, except that the discharge gas pressure during the deposition of ITO and Mo was changed to those shown in Table 1.

TABLE 1

| | Kind of transparent conductive film | Discharge gas pressure during deposition of transparent conductive film (Pa) | Discharge gas pressure during deposition of Mo film (Pa) | Internal stress of transparent conductive film (MPa) | Internal stress of transparent Mo film (MPa) | Difference of internal stress (MPa) | Adhesion strength by tape peel test | Scratch peel test (N) |
|---|---|---|---|---|---|---|---|---|
| Example 1 | ITO | 0.3 | 0.67 | −560 | 760 | 1320 | No peeling occurred | 5.47 |
| Example 2 | ITO | 0.6 | 0.67 | −220 | 760 | 980 | No peeling occurred | 7.61 |
| Example 3 | ITO | 0.1 | 1.0 | −620 | 470 | 1090 | No peeling occurred | 6.64 |
| Example 4 | ITO | 0.6 | 0.2 | −220 | 1330 | 1550 | Very slight peeling occurred | 5.12 |
| Example 5 | IZO | 0.6 | 0.2 | −110 | 1330 | 1440 | No peeling occurred | 5.36 |

TABLE 1-continued

| | Kind of transparent conductive film | Discharge gas pressure during deposition of transparent conductive film (Pa) | Discharge gas pressure during deposition of Mo film (Pa) | Internal stress of transparent conductive film (MPa) | Internal stress of transparent Mo film (MPa) | Difference of internal stress (MPa) | Adhesion strength by tape peel test | Scratch peel test (N) |
|---|---|---|---|---|---|---|---|---|
| Example 6 | ITZO | 0.6 | 0.2 | −140 | 1330 | 1470 | No peeling occurred | 5.34 |
| Comparative Example 1 | ITO | 0.1 | 0.2 | −620 | 1330 | 1950 | Peeling occurred | 0.98 |
| Comparative Example 2 | ITO | 0.3 | 0.2 | −560 | 1330 | 1890 | Peeling occurred | 1.32 |

INDUSTRIAL APPLICABILITY

The multilayer structure of the invention can be used as an electrode for an electrical circuit of an electronic device, and can be used for producing an electric circuit of an electronic device using the electrode.

The invention claimed is:

1. A multilayer structure comprising a transparent conductive thin film and a molybdenum metal thin film wherein difference of internal stress between the transparent conductive thin film and the molybdenum metal thin film is 1600 MPa or less.

2. The multilayer structure according to claim 1 wherein the transparent conductive thin film is a thin film containing indium oxide and tin oxide.

3. The multilayer structure according to claim 1 wherein the transparent conductive thin film is a thin film containing indium oxide and zinc oxide.

4. The multilayer structure according to claim 1 wherein the transparent conductive thin film is a thin film containing indium oxide, tin oxide and zinc oxide.

5. The multilayer structure according to claim 1 wherein the transparent conductive thin film is a thin film containing indium oxide and an oxide of a rare earth element.

6. An electrode for an electrical circuit comprising the multilayer structure according to claim 1.

7. An electronic device comprising, as at least part thereof, an electrical circuit comprising the electrode for an electrical circuit according to claim 6.

8. An electronic device comprising, as at least part thereof, the multilayer structure according to claim 1.

9. A method for producing the multilayer structure according to claim 1 comprising forming a transparent conductive thin film by sputtering at a first discharge gas pressure and forming a molybdenum metal thin film by sputtering at a second discharge gas pressure, the first discharge gas pressure and the second discharge gas pressure being adjusted to cause difference of internal stress between the transparent conductive film and the metal thin film to be 1600 MPa or less.

10. The method for producing the multilayer structure according to claim 9, wherein the transparent conductive thin film is formed using argon, or a mixture of argon and oxygen, as the film formation gas.

11. The method for producing the multilayer structure according to claim 9, wherein the molybdenum thin film is formed using argon, or a mixture of argon and oxygen, as the film formation gas.

12. The method for producing the multilayer structure according to claim 9, wherein the first discharge gas pressure is 0.1 to 5 Pa and the second discharge gas pressure is 0.1 to 2 Pa.

13. The multilayer structure according to claim 1 produced by forming a transparent conductive thin film by sputtering at a first discharge gas pressure and forming a molybdenum metal thin film by sputtering at a second discharge gas pressure, the first discharge gas pressure and the second discharge gas pressure being adjusted to cause difference of internal stress between the transparent conductive film and the metal thin film to be 1600 MPa or less.

14. An electrode for an electrical circuit comprising the multilayer structure according to claim 13.

15. An electronic device comprising, as at least part thereof, an electrical circuit comprising the electrode for an electrical circuit according to claim 14.

16. An electronic device comprising, as at least part thereof, the multilayer structure according to claim 13.

17. The multilayer structure according to claim 1, wherein the thickness of the transparent conductive thin film is 10 to 500 nm, and the thickness of the molybdenum metal thin film is 10 to 500 nm.

18. The multilayer structure according to claim 1, wherein the thickness of the transparent conductive thin film is 10 to 100 nm, and the thickness of the molybdenum metal thin film is 20 to 200 nm.

19. The multilayer structure according to claim 1, wherein the transparent conductive thin film contains one or more oxides selected from indium oxide, tin oxide, zinc oxide, and oxides of rare earth elements.

20. The multilayer structure according to claim 1, wherein the transparent conductive thin film is an indium oxide-tin oxide thin film, an indium oxide-zinc oxide thin film, an indium oxide-tin oxide-zinc oxide thin film, an indium oxide-cerium oxide thin film, or an indium oxide-samarium oxide thin film.

* * * * *